(12) United States Patent
Northrup et al.

(10) Patent No.: US 6,618,418 B2
(45) Date of Patent: Sep. 9, 2003

(54) DUAL III-V NITRIDE LASER STRUCTURE WITH REDUCED THERMAL CROSS-TALK

(75) Inventors: John E. Northrup, Palo Alto, CA (US); Michael A. Kneissl, Mountain View, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/000,898

(22) Filed: Nov. 15, 2001

(65) Prior Publication Data

US 2003/0091085 A1 May 15, 2003

(51) Int. Cl.[7] .................................................. H01S 5/00
(52) U.S. Cl. ............................. 372/46; 372/43; 372/45; 372/50
(58) Field of Search ............................. 372/46, 43, 45, 372/50

(56) References Cited

U.S. PATENT DOCUMENTS

| | | | | |
|---|---|---|---|---|
| 5,153,889 A | * | 10/1992 | Sugawara et al. | 372/45 |
| 5,805,630 A | | 9/1998 | Valster et al. | 372/50 |
| 5,831,960 A | * | 11/1998 | Jiang et al. | 369/121 |
| 5,917,847 A | * | 6/1999 | Sun | 372/50 |
| 6,058,124 A | * | 5/2000 | Sun et al. | 372/46 |
| 6,167,074 A | * | 12/2000 | Sun et al. | 372/46 |
| 6,239,033 B1 | * | 5/2001 | Kawai | 438/693 |

* cited by examiner

Primary Examiner—Paul Ip
Assistant Examiner—Leith A Al-Nazer
(74) Attorney, Agent, or Firm—William Propp

(57) ABSTRACT

A dual III–V nitride laser structure has a thick current spreading layer on a sapphire substrate and a trench extending into the current spreading layer to reduce thermal cross-talk between the dual lasers.

21 Claims, 7 Drawing Sheets

DUAL III–V NITRIDE LASER STRUCTURE WITH REDUCED THERMAL CROSS-TALK

BACKGROUND OF THE INVENTION

The present invention relates to a dual III–V nitride laser structure with a sapphire substrate and, more particularly, to a dual III–V nitride laser structure with a trench into a thick current spreading layer to separate the dual lasers to reduce thermal cross-talk.

Solid state lasers, also referred to as semiconductor lasers or laser diodes, are well known in the art. These devices generally consist of a planar multi-layered semiconductor structure having one or more active semiconductor layers bounded at their ends by cleaved surfaces that act as mirrors. The semiconductor layers on one side of the active layer in the structure are doped with impurities so as to have an excess of mobile electrons. The semiconductor layers on the other side of the active layer in the structure are doped with impurities so as to have a deficiency of mobile electrons, therefore creating an excess of positively charged carriers called holes. Layers with excess electrons are said to be n-type, i.e. negative, while layers with excess holes are said to be p-type, i.e. positive.

An electrical potential is applied through electrodes between the p-side and the n-side of the layered structure, thereby driving either holes or electrons or both in a direction perpendicular to the planar layers across the p-n junction so as to "inject" them into the active layers, where electrons recombine with holes to produce light. Optical feedback provided by the cleaved mirrors allows resonance of some of the emitted light to produce coherent "lasing" through the one mirrored edge of the semiconductor laser structure.

The III–V nitrides make possible diode lasers that operate at room temperature and emit shorter-wavelength visible light in the blue-violet range under continuous operation. The III–V nitrides comprise compounds formed from group III and V elements of the periodic table. The III–V nitrides can be binary compounds such as gallium nitride (GaN), aluminum nitride (AlN), or indium nitride (InN), as well as ternary alloys of aluminum gallium nitride (AlGaN) or indium gallium nitride (InGaN), and quarternary alloys such as aluminum gallium indium nitride (AlGaInN).

These materials are highly promising for use in short-wavelength light emitting devices for several important reasons. Specifically, the AlGaInN system has a large bandgap covering the entire visible spectrum. III–V nitrides also provide the important advantage of having a strong chemical bond which makes these materials highly stable and resistant to degradation under high electric current and intense light illumination conditions that are present at active regions of the devices. These materials are also resistant to dislocation formation once grown.

Semiconductor laser structures comprising group III–V nitride semiconductor layers grown on a sapphire substrate will emit light in the near ultra-violet to visible spectrum within a range including 360 nm to 650 nm.

The shorter wavelength of blue/violet laser diodes provides a smaller spot size and a better depth of focus than the longer wavelength of red and infrared (IR) laser diodes for laser printing operations and high density-optical storage. In addition, blue lasers can potentially be combined with existing red and green lasers to create projection displays and color film printers.

This type of laser is employed in communication systems, laser xerography, and other applications where the device's small size, low operating current, and other characteristics are beneficial. The performance of many devices, such as laser printers and optical memories, can be improved by the incorporation of multiple laser beams. For example, laser printers which use multiple beams can have higher printing speeds and/or better spot acuity than printers which use only a single beam.

Two lasers or dual lasers can be fabricated on the same substrate to provide closely spaced, independently addressable laser beams for such applications.

In virtually all of the applications of these lasers, it is necessary to modulate the output of the laser. Where a number of solid state lasers are integrated onto a single substrate, it is almost always necessary to modulate the output of each laser independently. In some applications this modulation is at a very high frequency, in others it is at a low frequency, and in still others this frequency will vary. Since lasing depends on a current flowing into the active layer, one obvious way to modulate the light output of a laser is to modulate the driving current. In fact, varying the driving current is presently the most common and conventional way in which a laser's output is modulated. However, this method of modulation has a number of distinct drawbacks and disadvantages, among which is transient heating of the chip on which the laser or lasers are formed.

Heat is generated through voltages drops across the metal electrode/semiconductor interfaces, which have a finite resistance, and through voltage drops across the resistive semiconductor layers. Energy is also introduced into the active region of the laser by injecting electrons into the conduction band and/or holes into the valence band. Electrons relax into the lowest energy state of the conduction band and holes relax into the lowest energy state of the valence band through non-light emitting processes and release their energy in the form of heat.

When a laser diode is switched from the OFF to the ON state, e.g. by forward biasing the laser diode at a constant current above threshold, laser operation is obtained very quickly (typically ~ns), while the device temperature continues to increase until it reaches equilibrium (typically several hundred $\mu$s). This transient heating, or heating that changes over time, can cause the light output of that III–V nitride blue laser diode and any adjacent III–V nitride blue laser diodes to drop as the threshold current of the laser device increases with temperature.

The desired separation between adjacent laser diodes in a dual laser structure may be 20 microns. Under these circumstances, the heat dissipated during the operation of one laser increases the temperature in the active region of the other laser. This is known in the art as thermal cross-talk. Thermal cross-talk renders the power output of the neighboring laser unpredictable and erratic.

High speed and high resolution printing requires laser devices with little or no fluctuations of the output power. For example, the variation in the laser light output required for red and IR laser diodes for printing applications is smaller than 4% and those requirements would be similar for III–V nitride blue laser diodes.

Another related consequence of transient heating of a laser is wavelength variation. Essentially, the operating wavelength of a laser diode is dependent on the temperature of the laser diode. If the temperature varies, the wavelength of operation will vary. Thermal cross-talk from one laser diode will change the wavelength of the light emitted from an adjacent laser diode.

Group III–V nitride blue lasers are particularly susceptible to thermal cross-talk due to the poor thermal conductivity of the sapphire substrate and the relatively high electric power consumption of III-nitride base laser device. For example, AlGaInN laser devices have threshold currents in the order of 50 mA and operating voltages of 5 V (compared to about 15 mA and 2.5 V for red lasers).

One method of reducing thermal cross-talk is to separate the dual lasers in the semiconductor structure with a groove extending between the two lasers into the substrate, as taught in U.S. Pat. No. 5,805,630 to Valster et al. The two red/IR lasers are formed from gallium arsenide semiconductor layers and the substrate that the groove extends into is also gallium arsenide.

Unfortunately, removing a significant portion of the substrate as taught in that patent weakens the structural integrity of the entire semiconductor structure and makes it more susceptible to breakage.

Furthermore, a III-V nitride blue laser structure typically has a sapphire substrate which is especially difficult to etch a groove into, possibly damaging any III-V nitride semiconductor layers already deposited on the substrate or damaging the exposed surface of the substrate for any subsequent deposition of III-V semiconductor layers. Any groove successfully fabricated in a sapphire substrate weakens the substrate to probable breakage or shattering.

It is an object of the present invention to provide a dual III-V nitride laser structure with reduced thermal cross-talk.

SUMMARY OF THE INVENTION

According to the present invention, a dual III-V nitride laser structure has a GaN current spreading layer with a thickness of between 1 and 40 microns on a sapphire substrate. A 10 micron wide trench extends through the laser structure separating the dual lasers and extends 50 percent to 100 percent through the thick current spreading layer towards the sapphire substrate. The current spreading layer and the trench extending into the current spreading layer reduce thermal cross-talk between the dual lasers. This reduction in thermal cross-talk allows the lasers to operate with smaller temperature variations and hence with greater stability in the output intensity and wavelength.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DESCRIPTION OF THE INVENTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof.

Figure 1:
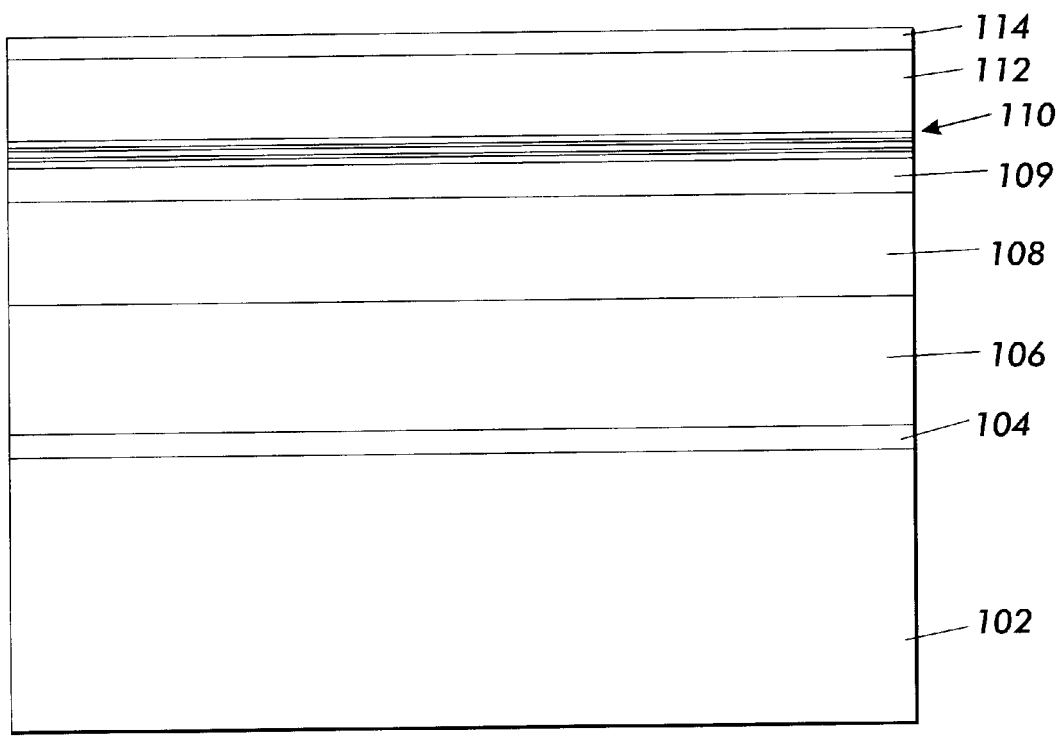
FIG. 1 is a cross-sectional side view of the dual III-V nitride laser structure of the present invention after III-V nitride semiconductor layer growth.

Reference is now made to FIG. 1 wherein is described the III-V nitride dual laser structure 100 of the present invention. The semiconductor laser structure 100 has a C-face (0001) or A-face (1120) oriented sapphire ($Al_2O_3$) substrate 102 on which is epitaxially deposited a succession of semiconductor layers. The sapphire substrate 102 typically has a thickness of 200 microns to 1000 microns. The sapphire substrate is an illustrative example, other possible substrates for the III-V nitride dual laser structure 100 of the present invention include silicon carbide (SiC), spinel ($MgAl_2O_4$), aluminum nitride (AlN) or gallium nitride (GaN).

The laser structure 100 includes an n-type buffer or nucleation layer 104 formed on the sapphire substrate 102. Typically, the buffer layer 104 is a binary or ternary III-V nitride material, such as, for example, GaN, AlN, InGaN or AlGaN. The buffer layer 104 in this illustrative example is undoped GaN and has typically a thickness in the range between 10 nm and 30 nm.

A second III-V nitride layer 106 is formed on the buffer layer 104. The second III-V nitride layer 106 is an n-type GaN or AlGaN layer. The second III-V nitride layer 106 acts as a lateral n-contact and current spreading layer. The second III-V nitride layer 106 typically has a thickness of from about 1 $\mu$m to about 20 $\mu$m. The second III-V nitride layer 106 is typically n-type GaN:Si.

A third III-V nitride layer 108 is formed over the second III-V nitride layer 106. The third III-V nitride layer 106 is an n-type cladding layer. The third III-V nitride layer 106 typically has a thickness of from about 0.2 $\mu$m to about 2 $\mu$m. The third III-V nitride layer 106 is typically n-type AlGaN:Si with an Al content larger than the second III-V nitride layer.

On top of the third III-V nitride layer 108, a waveguide layer 109 is formed followed by the InGaN quantum well active region 110. The waveguide layer 109 typically has a thickness of from about 50 nm to about 200 nm. The waveguide layer 109 is typically n-type GaN:Si, GaN:un, InGaN:un or InGaN:Si with an indium content smaller than the InGaN quantum well in the active region. The InGaN quantum well active region 110 is comprised of at least one InGaN quantum well. For multiple-quantum well active regions, the individual quantum wells typically have a thickness of from about 10 Å to about 100 Å and are separated by InGaN or GaN barrier layers which have typically a thickness of from about 10 Å to about 200 Å. The InGaN quantum wells and the InGaN or GaN barrier layers are typically undoped or can be Si-doped.

A fourth III–V nitride layer 112 is formed over the InGaN quantum well active region 110. The fourth III–V nitride layer 112 serves as a p-type cladding and current confinement layer. The fourth III–V nitride layer 112 typically has a thickness of from about 0.2 µm to about 1 µm. The fourth III–V nitride layer 112 is typically AlGaN:Mg.

A fifth III–V nitride layer 114 is formed over the fourth III–V nitride layer 112. The fifth III–V nitride layer 114 forms a p-contact layer for the minimum-resistance metal electrode to contact the p-side of the laser heterostructure 100. The fifth III–V nitride layer 114 typically is GaN:Mg and has a thickness of from about 10 nm to 200 nm.

The laser structure 100 can be fabricated by a technique such as metalorgainic chemical vapor deposition (MOCVD) or molecular beam epitaxy as is well known in the art.

The III–V nitride layers can be doped p-type or n-type by conventional processes. Examples of p-type dopants include, but are not limited to, Mg, Ca, C and Be. Examples of n-type dopants include, but are not limited to, Si, O, Se, and Te.

Figure 2:
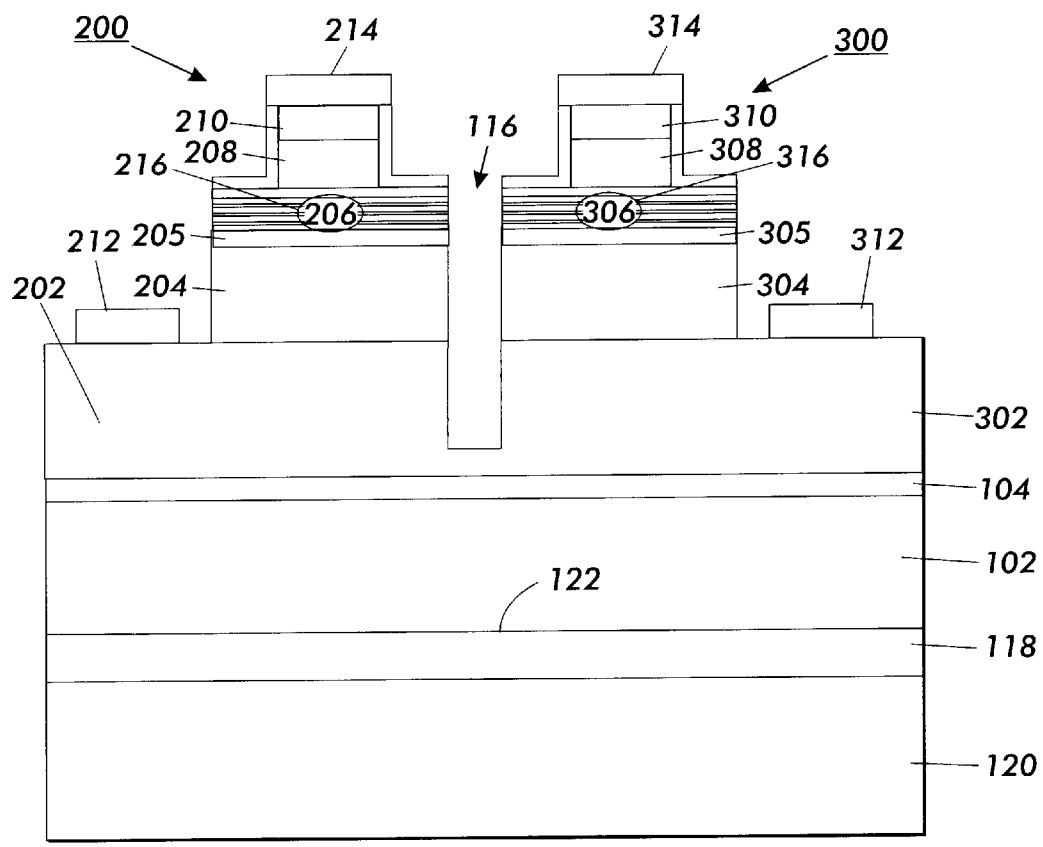
FIG. 2 is a cross-sectional side view of the dual III-V nitride laser structure with the two lasers separated by an etched trench for thermal cross-talk reduction.

As shown in FIG. 2, a trench 116 is etched through the III–V nitride dual laser structure 100 into the GaN current spreading layer 106. Dry-etching with CAIBE (chemical assisted ion beam etching) or RIE (reactive ion beam etching) in an Ar/Cl$_2$/BCl$_3$ gas mixture is used to etch the trench 116. The trench 116 is 10 microns wide.

The trench 116 serves three functions. First, it separates the dual laser structure 100 into a first laser 200 and a second laser 300. Second, the trench 116 electrically isolates the first laser 200 and the second laser 300. Third, the trench 116 thermally isolates the first laser 200 and the second laser 300 and reduces thermal cross-talk between the dual lasers of the III–V nitride dual laser structure 100.

After the etching of the thermal isolation trench 116, the fabrication of the III–V nitride dual laser structure 100 continues.

The trench 116 separates the dual laser structure 100 into a first laser 200 and a second laser 300.

The first laser 200 has an n-current spreading layer 202, an n-cladding layer 204, an n-waveguide layer 205, an active layer 206, a p-cladding layer 208 and a p-contact layer 210. The second laser 300 has an n-current spreading layer 302, an n-cladding layer 304, an n-waveguide layer 305, an active layer 306, a p-cladding layer 308 and a p-contact layer 310.

The first laser n-current spreading layer 202 is separate and distinct from the second laser n-current spreading layer 302 but both are formed from the n-current spreading layer 106 before the trench 116 is etched.

The first laser n-cladding layer 204 is separate and distinct from the second laser n-cladding layer 304 but both are formed from the n-cladding layer 108 before the trench 116 is etched.

The first laser active layer 206 is separate and distinct from the second laser active layer 306 but both are formed from the active layer 110 before the trench 116 is etched.

The first laser p-cladding layer 208 is separate and distinct from the second laser p-cladding layer 308 but both are formed from the p-cladding layer 112 before the trench 116 is etched.

The first laser p-contact layer 210 is separate and distinct from the second laser p-contact layer 310 but both are formed from the p-contact layer 114 before the trench 116 is etched.

The partially etched current spreading layer 106, the nucleation layer 104 and the sapphire substrate 102 are common to both the first laser 200 and the second laser 300.

Dry-etching with CAIBE (chemical assisted ion beam etching) or RIE (reactive ion beam etching) in an Ar/Cl$_2$/BCl$_3$ gas mixture is used to etch the first laser 200 down to the GaN:Si current-spreading layer 202 and to etch the second laser 300 down to the GaN:Si current-spreading layer 302 for n-contact formation.

The n-current-spreading layer etching for the two lasers 200 and 300 can be done contemporaneously with the etching of the trench 116 or in separate etching steps.

An n-electrode 212 is formed on the etched, exposed n-current-spreading layer 202 of the first laser 200, which is functioning as a lateral contact layer. An n-contact 312 is formed on the etched, exposed n-current-spreading layer 302 of the second laser 300, which is functioning as a lateral contact layer. The n-electrode metal can be deposited by thermal evaporation, electron-beam evaporation or sputtering. Typically Ti/Al, Ti/Au or Ti/Al/Au are used as n-metal electrodes. The etching of the trench 116 and the n-current spreading layers 202 and 302 creates a mesa laser 200 with a width of 60 microns and a mesa laser 300 also with a width of 60 microns.

In a separate etching step, ridge-waveguides are formed by etching into the p-AlGaN cladding layer 208 and 308 with CAIBE (chemical assisted ion beam etching) or RIE (reactive ion beam etching) in an Ar/Cl$_2$/BCl$_3$ gas mixture. The ridge-waveguide and consequently the electrically pumped portion of the active region 216 of the first active layer 206 of the first laser 200 is 2 microns wide and approximately 1 micron thick. The ridge-waveguide and consequently the electrically pumped portion of the active region 316 in the second active layer 306 of the second laser 300 is 2 microns wide and 1 micron thick. The first active region 216 is separated from the second active region 316 by 20 microns. A p-electrode 214 is formed on the p-contact layer 210 of the first laser 200. A p-electrode 314 is formed on the p-contact layer 310 of the second laser 300. Ni/Au, NiO/Au, Pd/Au, Pd/Au/Ti/Au, Pd/Ti/Au, Pd/Ni/Au, Pt/Au or Pd/Pt/Au can be deposited as p-contact metal by thermal evaporation, electron-beam evaporation or sputtering.

The two p-electrodes 214 and 314 are separate and distinct. This allows for independent addressability of the first and second laser 200 and 300. To further electrically isolate both lasers 200 and 300, the n-electrodes 212 and 312 can also be separate and distinct.

A 20 micron thick indium bonding layer 118 and a heat sink 120 are attached to the sapphire substrate 102 on the opposite side 122 from the first and second laser 200 and 300. Instead of indium, other materials e.g. Ti/In, Ti/Au/In, AuSn, Ti/AuSn, Ti/Au/AuSn, may be used as bonding layer. The bonding layer materials can be deposited by thermal evaporation, sputtering or e-beam evaporation. The heat sink 120 has a sufficiently large thermal mass so that its temperature remains independent of the power dissipated by the lasers.

The laser facets (not shown in this Figure) can be formed either by cleaving or dry-etching (e.g. CAIBE). A SiO$_2$/TiO$_2$, SiO$_2$/Ta$_2$O$_5$ or SiO$_2$/HfO$_2$ high reflective coating can be deposited on the backside of the first and second laser diode facets by e-beam evaporation in order to enhance the mirror reflectivity. A SiO or SiO$_2$ anti-reflective coating can be deposited on the front side of the first and second laser diode facet using e-beam evaporation.

The first laser 200 will be forward biased by an input current applied through the p-electrode 214 and the n-electrode 212. The current will cause electrons to flow from the n-doped layers of the n-current spreading layer 202 and the lower cladding layer 204 into the first active layer 206. The current also causes holes to flow from the p-doped layers of the contact layer 210 and upper cladding layer 208 into the first active layer 206. Recombination of the electrons and holes in the first active region 216 at a sufficient current will cause stimulated emission of light.

Independently, the second laser 300 will be forward biased by an input current applied through the p-electrode 314 and the n-electrode 312. The current will cause electrons to flow from the n-doped layers of the current spreading layer 302 and the lower cladding layer 304 into the second active layer 306. The current also causes holes to flow from the p-doped layers of the contact layer 310 and upper cladding layer 308 into the second active layer 236. Recombination of the electrons and holes in the second active region 316 at a sufficient current will cause stimulated emission of light.

The depth of the trench 116 and the thickness of the current spreading layer 106 are critical for effective reduction of thermal cross-talk of the III–V nitride semiconductor layers deposited on the sapphire substrate of the laser structure 100.

A dual laser semiconductor structure should have a thermal cross-talk of less than 10 Kelvins/watt. A III–V nitride dual laser semiconductor structure with an isolation trench which extends through the p-contact layer, the p-cladding layer, the active layer, the n-cladding layer and only to the interface of the n-cladding layer and the n-current spreading layer does not meet that requirement.

Figure 3:
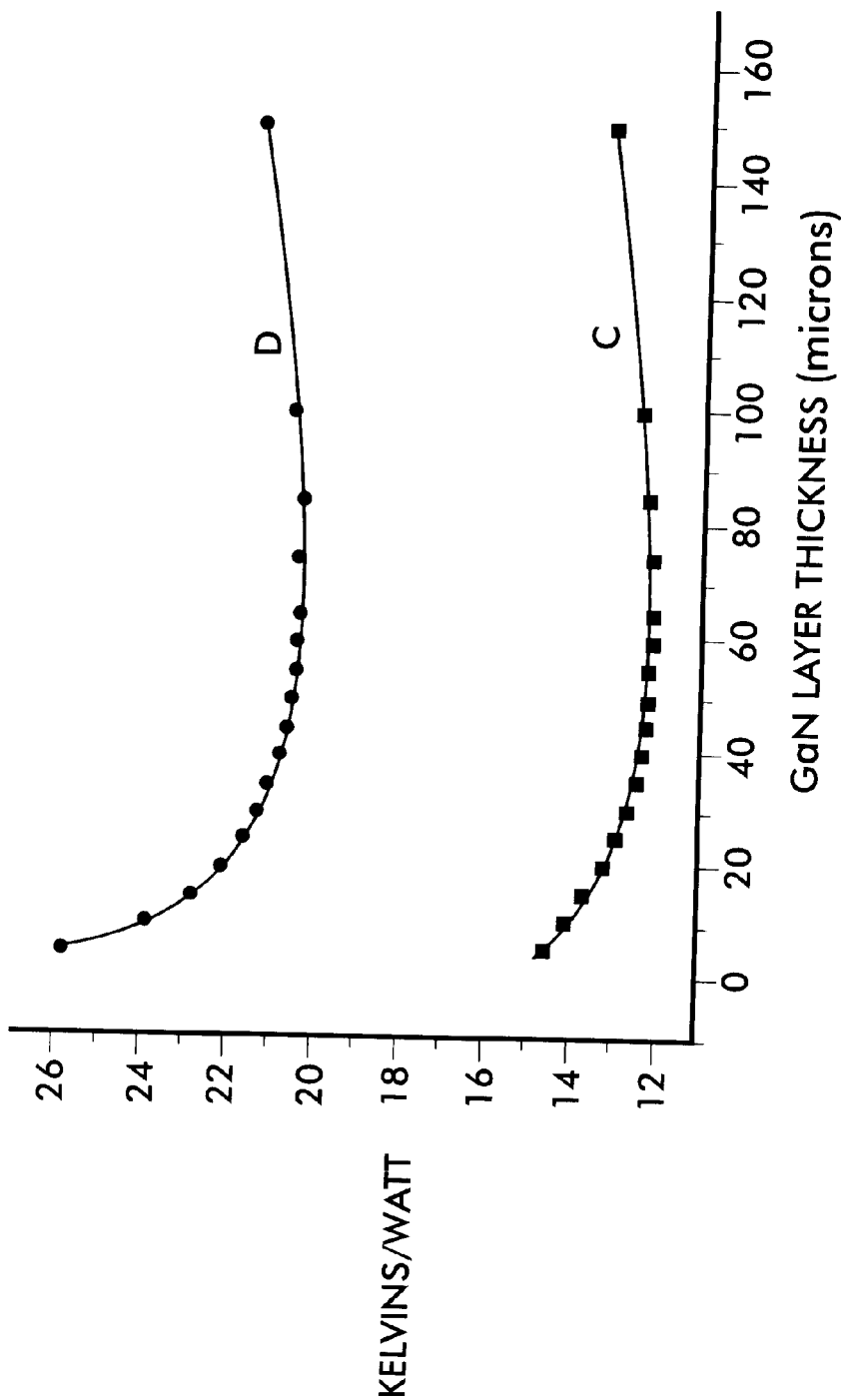
FIG. 3 is a graph showing cross-talk versus current spreading layer thickness for a dual laser structure.

As shown in the graph of FIG. 3, the thermal cross-talk (C) and the power output droop (D) are a function of the thickness of the GaN current-spreading layer. The cross-talk and droop decrease quickly as the thickness of the current spreading layer increases from 5 microns to approximately 40 microns. This thermal cross-stalk reduction is due to the lateral heat spreading that takes place in the GaN current spreading layer. However, the cross-talk and droop will eventually start to increase as the GaN current spreading layer thickness increases greater than approximately 80 microns. This thermal cross-talk increase is due to the vertical transport of heat in the current spreading layer from one laser to the other laser. The benefit to reducing cross-talk is having a current spreading layer with a thickness of greater than 15 microns but less than 40 microns.

However, with the isolation trench only extending down to the interface of the current spreading layer, the thermal cross-talk does not reach a value below the threshold of less than 10 Kelvins/watt.

Returning to the III–V nitride dual laser structure 100 of FIG. 2, the trench 116 is etched through the p-contact layer 114, the p-cladding layer 112, the active layer 110, the n-cladding layer 108, and 90 percent into the n-current spreading layer 106. The current spreading layer 106 in this illustrative example is 20 microns thick so the isolation trench 116 extends 18 microns into the current spreading layer.

Figure 4:
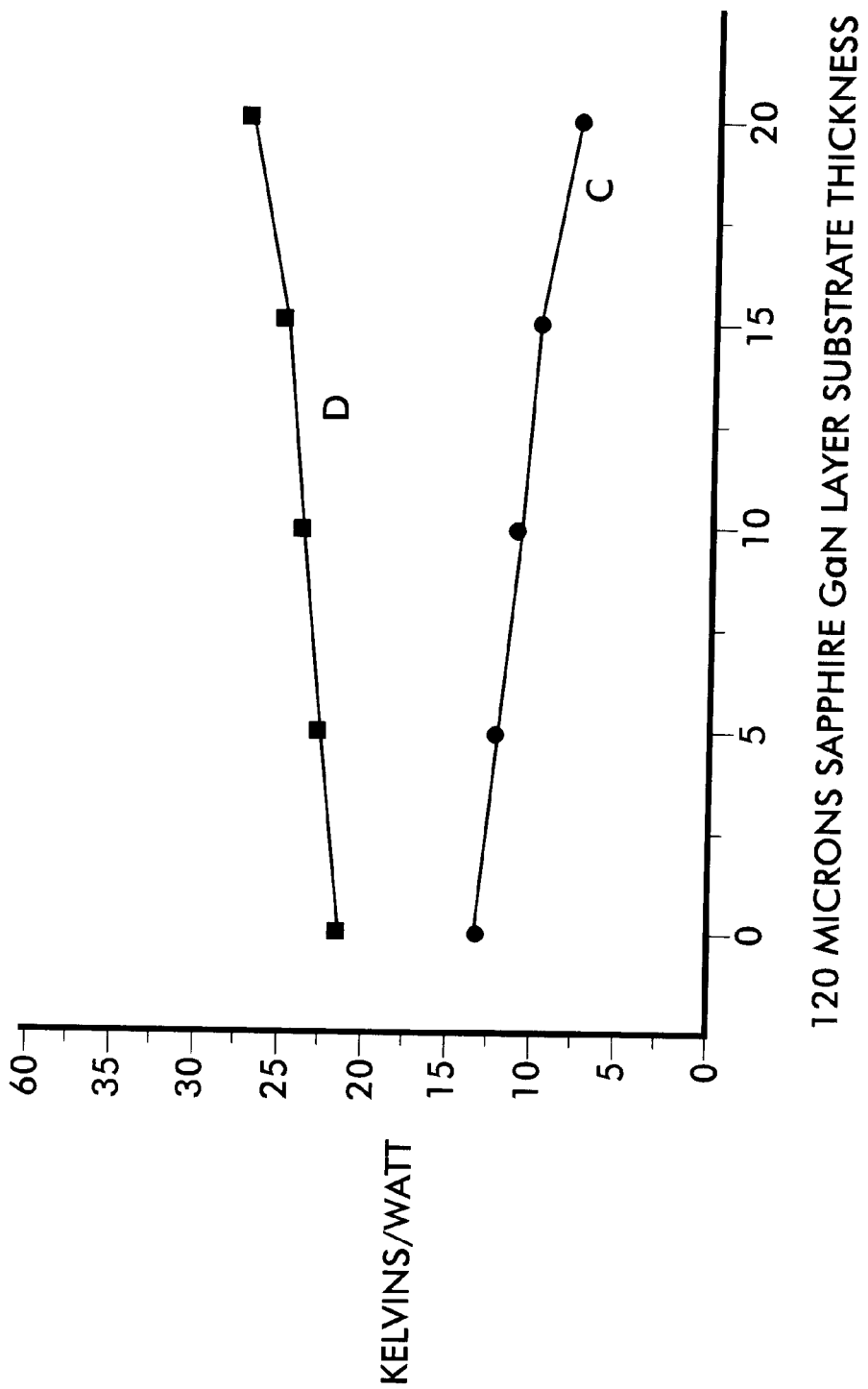
FIG. 4 is a graph showing cross-talk versus current spreading layer thickness for a dual laser structure with an etched trench extending into a thick current spreading layer.

As shown in the graph of FIG. 4, for a 20 micron thick current spreading layer, the thermal cross-talk is less than 10 Kelvins/watt when the trench depth in the current spreading layer is greater than 10 microns. The droop will increase slightly as the depth of the trench increases but this is within tolerance levels. The 90 percent etch is merely an illustrative example, the etch depth can be from 50% to 100% of the thickness of the current spreading layer.

Figure 5:
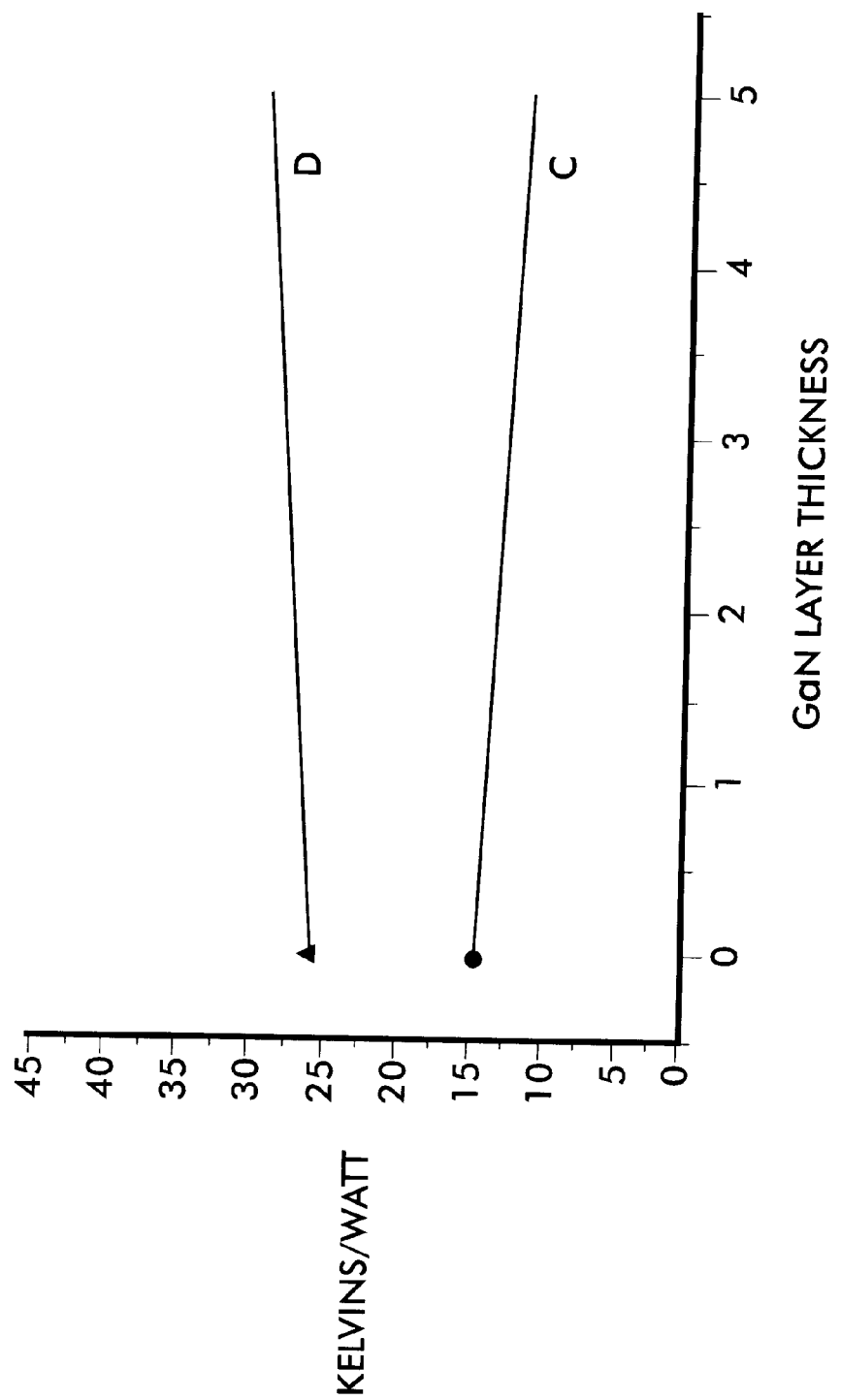
FIG. 5 is a graph showing cross-talk versus current spreading layer thickness for a dual laser structure with an etched trench extending into a thin current spreading layer.

As shown in the graph of FIG. 5, for a 5 micron thick current spreading layer, even when the trench is etched completely through the current spreading layer, the thermal cross-talk remains above the threshold level of 10 Kelvin/watts. This illustrates the importance of having a sufficiently thick GaN current spreading layer for the dual III–V nitride laser structure in order to efficiently reduce thermal cross-talk between the dual lasers. A too thin current spreading layer even with a trench will not reduce the thermal cross-talk to acceptable levels.

The high thermal conductivity of the GaN current spreading layer relative to the adjacent sapphire substrate makes it beneficial to employ a thick GaN current spreading layer to spread the heat laterally before vertical transport of the heat through the sapphire substrate to the heat sink.

The remaining unetched 10 percent of the current spreading layer 106 of the laser structure 100 also provides a minimum thickness to reduce the electrical conductivity between the two lasers while maintaining independent addressability.

In summary, the dual III–V nitride laser structure is grown on a substrate. The laser structure is fabricated on a thick (5 to 40 micron) GaN current spreading layer. The ideal thickness for reducing thermal cross-talk is greater than 15 microns which enables more efficient lateral heat spreading. The dual lasers are separated by 20 to 50 microns in the lateral direction. A 10 micron wide trench separates the dual lasers and extends through the laser semiconductor structure at least 50 to 100 percent of the distance through the GaN current spreading layer but does not extend into the substrate.

The depth of the trench 116 and the thickness of the current spreading layer 106 are critical for effective reduction of thermal cross-talk from the two lasers of the III–V nitride semiconductor layers deposited on the sapphire substrate of the dual laser structure 100. The thermal cross-talk reduction allows the lasers to operate in a narrower temperature range and hence with greater stability in the output intensity and wavelength frequency.

Figure 6:
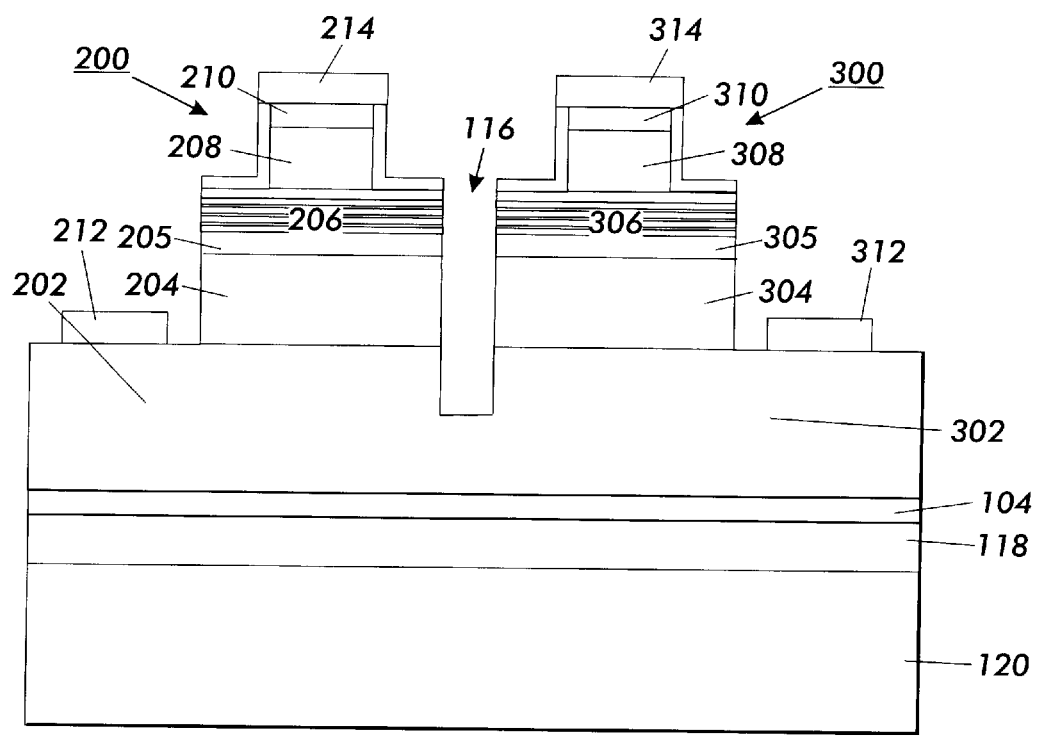
FIG. 6 is a cross-sectional side view of a dual III-V nitride laser structure without a sapphire substrate with the two lasers separated by an etched trench for thermal cross-talk reduction.
Figure 7:
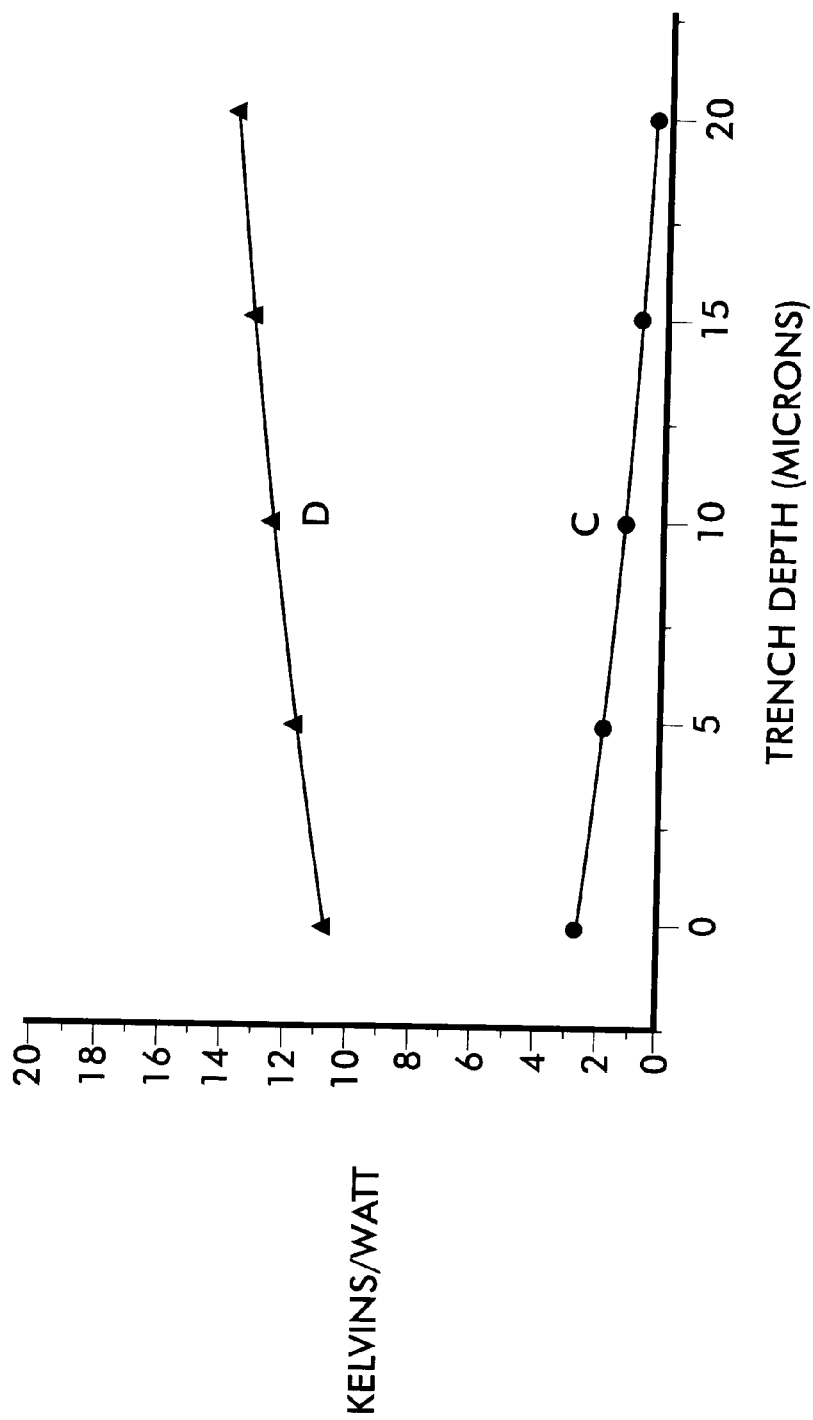
FIG. 7 is a graph showing cross-talk versus current spreading layer thickness for a dual III-V nitride laser structure without a sapphire substrate.

As shown in the alternate embodiment of FIG. 6, the sapphire substrate 102 of the dual laser structure 100 can be removed by a laser assisted lift-off procedure, as is known in the art. The GaN nucleation layer 104 is then connected to the heat sink 120 by the indium bonding layer 118. Thermal cross-talk is less than 3 Kelvins/watt without the trench 116 as shown in the graph of FIG. 7. With a trench etched into the current spreading layer, the thermal cross-talk is less than 1 Kelvins/watt.

The laser diode structure according to the invention described above can be applied to any device requiring compact laser structures, including high resolution laser printing devices, digital printers, display devices, projection displays, high density optical storage devices, including magneto-optical storage devices, including CD-ROM and DVD's whereby data is stored on a magneto-optical disk, fiber-optic communications devices, including for fiber optic emitters and repeaters and undersea communications devices (sea water is most transparent in the blue-green spectrum). The laser diode structure according to the invention can also be applied to any device requiring compact laser diode structures, including illumination devices and full color displays, including monolithically integrated pixels for full color displays.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A dual semiconductor laser structure comprising:
   a substrate;
   a III–V nitride semiconductor current spreading layer having a thickness of at least 5 microns formed on said substrate;
   a plurality of III–V nitride semiconductor layers formed on said current spreading layer such that at least one of said plurality of III–V nitride semiconductor layers forms an active layer;
   a trench extending through said plurality of III–V nitride semiconductor layers and partially extending through said current spreading layer, said trench forming a first laser and a second laser from said plurality of III–V nitride semiconductor layers;
   wherein a sufficient forward bias can be applied to said first laser such that stimulated emission is caused to occur therein, wherein a sufficient forward bias can be applied to said second laser such that stimulated emission is caused to occur therein and wherein the depth of said trench and the thickness of said current spreading layer reduce thermal cross-talk between said first laser and second laser.

2. The dual semiconductor laser structure of claim 1 wherein said trench extends more than 50 percent into said current spreading layer.

3. The dual semiconductor laser structure of claim 1 wherein said trench extends approximately 90 percent into said current spreading layer.

4. The dual semiconductor laser structure of claim 3 wherein said current spreading layer has a thickness of 20 microns.

5. The dual semiconductor laser structure of claim 1 wherein said current spreading layer has a thickness between 15 and 40 microns.

6. The dual semiconductor laser structure of claim 1 wherein said current spreading layer has a thickness of 20 microns.

7. The dual semiconductor laser structure of claim 1 wherein said substrate is sapphire.

8. The dual semiconductor laser structure of claim 1 wherein said substrate is silicon carbide.

9. The dual semiconductor laser structure of claim 1 wherein said substrate is gallium nitride.

10. The dual semiconductor laser structure of claim 1 wherein said substrate is spinel.

11. The dual semiconductor laser structure of claim 1 wherein said substrate is aluminum nitride.

12. The dual semiconductor laser structure of claim 1 further comprising
    a metal bonding layer formed on said sapphire substrate opposite said current spreading layer; and
    a heat sink attached to said metal bonding layer.

13. The dual semiconductor laser structure of claim 1 wherein the trench is at least 4 microns deep.

14. A dual semiconductor laser structure comprising:
    a III–V nitride semiconductor current spreading layer having a thickness of at least 5 microns;
    a plurality of III–V nitride semiconductor layers formed on said current spreading layer such that at least one of said plurality of III–V nitride semiconductor layers forms an active layer;
    a trench extending through said plurality of III–V nitride semiconductor layers and partially extending through said current spreading layer, said trench forming a first laser and a second laser from said plurality of III–V nitride semiconductor layers;
    wherein a sufficient forward bias can be applied to said first laser such that stimulated emission is caused to occur therein, wherein a sufficient forward bias can be applied to said second laser such that stimulated emission is caused to occur therein; and wherein the depth of said trench and the thickness of said current spreading layer reduce thermal cross-talk between said first laser and said second laser.

15. The dual semiconductor laser structure of claim 14 wherein said trench extends more than 50 percent into said current spreading layer.

16. The dual semiconductor laser structure of claim 14 wherein said trench extends approximately 90 percent into said current spreading layer.

17. The dual semiconductor laser structure of claim 16 wherein said current spreading layer has a thickness of 20 microns.

18. The dual semiconductor laser structure of claim 14 wherein said current spreading layer has a thickness between 15 and 40 microns.

19. The dual semiconductor laser structure of claim 14 wherein said current spreading layer has a thickness of 20 microns.

20. The dual semiconductor laser structure of claim 14 further comprising
    a metal bonding layer formed on said current spreading layer opposite said plurality of III–V nitride semiconductor layers; and
    a heat sink attached to said metal bonding layer.

21. The dual semiconductor laser structure of claim 14 wherein the trench is at least 4 microns deep.

* * * * *